(12) United States Patent
Lan et al.

(10) Patent No.: US 12,557,466 B2
(45) Date of Patent: Feb. 17, 2026

(54) LIGHT-TRANSMITTING PEROVSKITE SOLAR CELL

(71) Applicant: TAIWAN PEROVSKITE SOLAR CORP., Zhubei (TW)

(72) Inventors: Shiang Lan, Zhubei (TW); Yu-Hu Li, Zhubei (TW); Chih-Hsuan Chao, Zhubei (TW)

(73) Assignee: TAIWAN PEROVSKITE SOLAR CORP., Zhubei (TW)

( * ) Notice: Subject to any disclaimer, the term of this patent is extended or adjusted under 35 U.S.C. 154(b) by 21 days.

(21) Appl. No.: 18/520,695

(22) Filed: Nov. 28, 2023

(65) Prior Publication Data
US 2025/0107310 A1   Mar. 27, 2025

(30) Foreign Application Priority Data
Sep. 26, 2023   (TW) .................. 112136898

(51) Int. Cl.
H10K 30/82   (2023.01)
H10K 30/30   (2023.01)
H10K 30/40   (2023.01)
H10K 30/88   (2023.01)
H10K 39/12   (2023.01)

(52) U.S. Cl.
CPC ............ *H10K 30/82* (2023.02); *H10K 30/30* (2023.02); *H10K 30/40* (2023.02); *H10K 30/88* (2023.02); *H10K 39/12* (2023.02)

(58) Field of Classification Search
CPC ........ H10K 30/08; H10K 30/40; H10K 30/30; H10K 30/88; H10K 39/12
See application file for complete search history.

(56) References Cited

U.S. PATENT DOCUMENTS
2022/0393053 A1*  12/2022  Watanabe ........... H10F 77/1223

FOREIGN PATENT DOCUMENTS
CN   111584670 A  *  8/2020   ........... H01L 31/078
CN   113421822 A  *  9/2021   ........... H10F 77/244

OTHER PUBLICATIONS
CN 111584670 A, Machine Translation (Year: 2020).*
(Continued)

Primary Examiner — Devina Pillay
(74) Attorney, Agent, or Firm — Troutman Pepper Locke LLP; Tim Tingkang Xia, Esq.

(57) ABSTRACT

The present invention provides a light-transmitting perovskite solar cell, which has a first package layer, a first light-transmitting electrode layer, a first carrier transport layer, a light absorbing layer, a second carrier transport layer, a second light-transmitting electrode layer, and a second package layer. The first light-transmitting electrode layer is disposed on an upper surface of the first package layer. The first carrier transport layer is disposed on an upper surface of the first light-transmitting electrode layer. The light absorbing layer is disposed on an upper surface of the first carrier transport layer. The second carrier transport layer is disposed on an upper surface of the light absorbing layer. The second light-transmitting electrode layer is disposed on an upper surface of the second carrier transport layer. The second package layer is disposed on an upper surface of the second light-transmitting electrode layer.

11 Claims, 4 Drawing Sheets

(56) References Cited

OTHER PUBLICATIONS

Girtan, "A review on oxide/metal/oxide thin films on flexible substrates as electrodes for organic and perovskite solar cells", Optical Materials: X 13 (2022) 100122, pp. 1-11 (Year: 2022).*
Spinelli, "Transparent conductive electrodes based on co-sputtered ultra-thin metal layers for semi-transparent perovskites solar cells", Appl. Phys. Lett. 118, 241110 (2021); pp. 241110-1-241110-7, Supplementary Materials pp. 1-9 (Year: 2021).*
Xiao, CN 113421822 A, Machine Translation (Year: 2021).*
Rani, Oxide-Metal-Oxide Based Transparent Electrodes and Their Potential Application in Semitransparent Perovskite Solar Cells—Optical Modeling Studies, Sol. RRL 2023, 7, 2200863, pp. 1-7 (Year: 2023).*

* cited by examiner

LIGHT-TRANSMITTING PEROVSKITE SOLAR CELL

CROSS-REFERENCE TO RELATED APPLICATIONS

This application claims priority to Taiwan Application Serial Number 112136898, filed Sep. 26, 2023, which is herein incorporated by reference in its entirety.

BACKGROUND

Technical Field

The present invention is in related to the field of green energy, more particularly to a perovskite solar cell with the characteristic of light-transmitting.

Related Art

Perovskite solar cells currently have two main structures, which includes a regular structure and a inverted structure. The difference between the regular structure and the inverted structure is that the stacking order of n-type semiconductor and p-type semiconductor between the two electrodes is reversed. The regular structure is the structure of n-i-p, and the inverted structure is the structure of p-i-n. "n" refers to n-type semiconductor, "p" refers to p-type semiconductor, and "I" refers to intrinsic semiconductor. The Fermi level (Ef) of n-type semiconductor is close to the conduction band, so the main carriers are Electrons, and conduct the generated electrons and block the electron holes. The Fermi level (Ef) of p-type semiconductor is close to the valence band, so the main carriers are electron holes, and conduct the generated electron holes and block the electrons. The Fermi level of the intrinsic semiconductor is close to the center of the energy gap. The intrinsic semiconductor absorbs photons first, and then generates a photocurrent, which is an electron-hole pair. Perovskite solar cell adopts a material with Perovskite crystal structure ($ABX_3$) to be the material of the intrinsic semiconductor. Through controlling the ion concentration, the light transmittance of the perovskite layer can be changed, so as to make the perovskite solar cell be a light-transmitting solar cell. Perovskite solar cells usually adopts metals such as gold or silver that are both conductive and match the valence band of p-type semiconductors to be as the electrodes on the backlight surface. The inverted structure uses copper or aluminum that match the conduction band of n-type semiconductors to be as the electrode on the backlight surface. Since electrodes formed by gold, silver, copper or aluminum may absorb light over a wide range of wavelengths, so they are with the characteristic of opaque. If perovskite solar cells are to be the characteristic of the light-transmitting, the electrode of the backlight surface adopts transparent conductive materials such as indium zinc oxide (IZO). However, the resistance of transparent conductive materials is higher than that of metal materials, so thicker transparent conductive materials is a must to reduce resistance, such as an IZO layer with a thickness of 70 nm. Accordingly, the aforesaid may postpone the preparation time of the electrodes, and affect the production speed as well. Even if a 70 nm IZO layer is used as the electrode, a problem of the resistance of 60Ω is still a negative factor; If a thickness of 60 nm of copper is adopted as the electrode layer, the resistance will be reduced to 10Ω, it still loses light-transmitting, and the energy levels of existing light-transmitting conductive materials are not as high as those of commonly used metal materials (For example, the precious metal, gold, has a Fermi level of about-5 eV). Therefore, it is difficult for perovskite solar cell electrodes to balance light-transmitting, low resistance and energy level matching.

SUMMARY

The purpose of the present invention discloses a light-transmitting perovskite solar cell, in order to figure out the difficulties that perovskite solar cell electrodes are hard to balance light-transmitting, low resistance and energy level matching.

Based on the purpose of the present invention, the present invention provides the light-transmitting perovskite solar cell, which has a first package layer, a first light-transmitting electrode layer, a first carrier transport layer, a light absorbing layer, a second carrier transport layer, a second light-transmitting electrode layer, and a second package layer. The first light-transmitting electrode layer is disposed on an upper surface of the first package layer. The first carrier transport layer is disposed on an upper surface of the first light-transmitting electrode layer. The light absorbing layer is disposed on an upper surface of the first carrier transport layer. The second carrier transport layer is disposed on an upper surface of the light absorbing layer. The second light-transmitting electrode layer is disposed on an upper surface of the second carrier transport layer. The second package layer is disposed on an upper surface of the second light-transmitting electrode layer. The second light-transmitting electrode layer has a light-transmitting modification layer, a first light-transmitting conductive layer, a metal conductive layer, and a second light-transmitting conductive layer. The first light-transmitting conductive layer is disposed on an upper surface of the light-transmitting modification layer. The metal conductive layer is disposed on an upper surface of the first light-transmitting conductive layer. The second light-transmitting conductive layer is disposed on an upper surface of the metal conductive layer.

In an embodiment of the present invention, the first carrier transport layer is an electron transport layer, and the second carrier transport layer is an electron hole transport layer.

In an embodiment of the present invention, the first carrier transport layer is an electron hole transport layer, and the second carrier transport layer is an electron transport layer.

In an embodiment of the present invention, a thickness of the light-transmitting modification layer is between 1 and 10 nm, further that of 1~5 nm.

In an embodiment of the present invention, a thickness of the metal conductive layer is between 1 and 10 nm, further that of 3~10 nm.

In an embodiment of the present invention, a thickness of the first light-transmitting conductive layer is between 1 and 100 nm.

In an embodiment of the present invention, a thickness of the first light-transmitting conductive layer is between 1 and 30 nm. For a preferred embodiment, the thickness of the first light-transmitting conductive layer is between 1 to 20 nm, even further to that of 10~20 nm, so as to reduce thickness of the first light-transmitting conductive layer.

In an embodiment of the present invention, a thickness of the second light-transmitting conductive layer is between 1 and 100 nm.

In an embodiment of the present invention, a thickness of the second light-transmitting conductive layer is between 1 and 30 nm. For a preferred embodiment, the thickness of the first light-transmitting conductive layer is between 1 to 20 nm, even further to that of 10~20 nm, so as to reduce thickness of the second light-transmitting conductive layer.

In an embodiment of the present invention, a light transmittance of the light-transmitting perovskite solar cell is greater than 70% in a wavelength range between 800 and 1,000 nm.

According to the above mentions, the technical characteristics of the second light-transmitting electrode layer of the light-transmitting perovskite solar cell of the present invention are able to indeed achieve the technical effects of light-transmitting, low resistance and energy level matching.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

Figure 1:
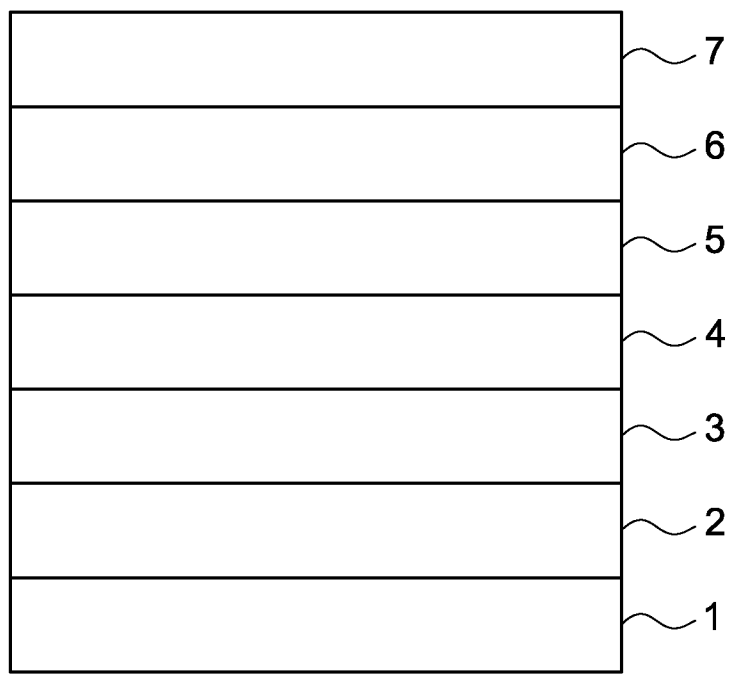
FIG. 1 illustrates a schematic stacking view of a structure of the light-transmitting perovskite solar cell of the present invention.
Figure 2:
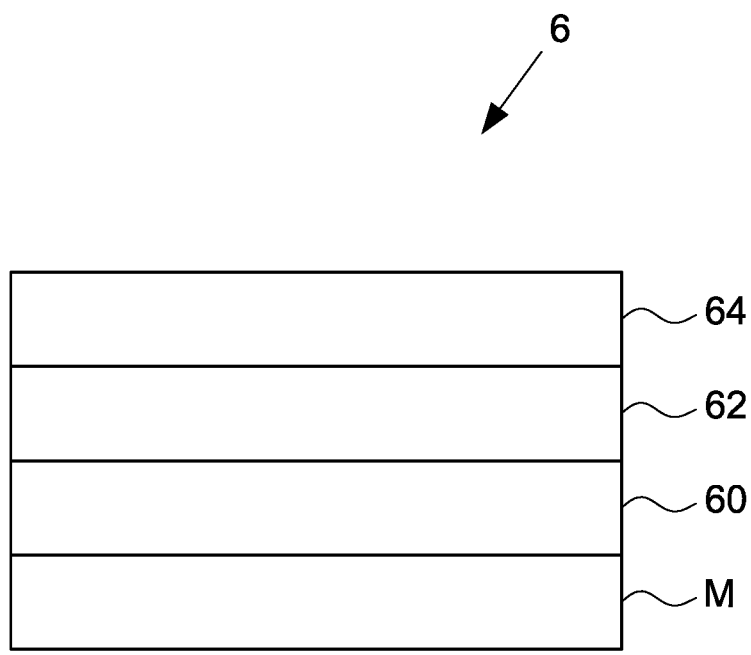
FIG. 2 illustrates a schematic stacking view of a structure of a second light-transmitting electrode layer of the present invention.

Please refer to FIG. 1 and FIG. 2, which disclose a light-transmitting perovskite solar cell of the present invention. The light-transmitting perovskite solar cell includes a first package layer 1, a first light-transmitting electrode layer 2, a first carrier transport layer 3, a light absorbing layer 4, a second carrier transport layer 5, a second light-transmitting electrode layer 6, and a second package layer 7, wherein the second light-transmitting electrode layer 6 has a light-transmitting modification layer M, a first light-transmitting conductive layer 60, a metal conductive layer 62, and a second light-transmitting conductive layer 64.

With reference to FIG. 1 and FIG. 2, the first package layer 1 is as a substrate, and the first light-transmitting electrode layer 2 is disposed on an upper surface thereof. An upper surface of the first light-transmitting electrode layer 2 is disposed the first carrier transport layer 3. An upper surface of the first carrier transport layer 3 is arranged the light absorbing layer 4, which has the second carrier transport layer 5 on an upper surface thereof. Logically, an upper surface of the second carrier transport layer 5 has the second light-transmitting electrode layer 6, which is disposed the second package layer 7 on its upper surface. A lower surface of the first package layer 1 is a surface that faces a light source, as well as the surface facing the light source for the light-transmitting perovskite solar cell of the present invention. In other words, the surface facing the light source is to absorb the light. The light source is the Sun as a preferred embodiment, and therefore it is the Sun light. The upper surface of the second package layer 7 is a surface facing away from the light source, and it is the surface facing away from the light source for the light-transmitting perovskite solar cell of the present invention. The material of the light absorbing layer 4 is perovskite. The second light-transmitting electrode layer 6 has the light-transmitting modification layer M, the first light-transmitting conductive layer 60, the metal conductive layer 62, and the second light-transmitting conductive layer 64. The light-transmitting modification layer M is arranged on the upper surface of the second carrier transport layer 5. The first light-transmitting conductive layer 60 is put on the upper surface of the light-transmitting modification layer M. The upper surface of the first light-transmitting conductive layer 60 has the metal conductive layer 62 thereon. The second light-transmitting conductive layer 64 is thus on the upper surface of the metal conductive layer 62. As it can be seen in figure, the upper surface of the second light-transmitting conductive layer 64 is the upper surface of the second light-transmitting electrode layer 6 as well.

For having the feature of light-transmitting property of the light-transmitting perovskite solar cell of the present invention, each of the layers of the light-transmitting perovskite solar cell must be with the feature of light-transmitting property. For decreasing the lose of the light when the light penetrates through the solar cell, the material of each of the layers is preferable to be greater than 3 eV (electron volt) in the aspect of energy gap except for the light absorbing layer 4. The light transmittance of the whole solar energy is mainly determined by the material composition of the light absorbing layer 4. That is, the overall light transmittance can be adjusted by adjusting the proportion of each element in the perovskite.

With respect to FIG. 1, which illustrates a preferred embodiment. The first package layer 1 and the second package layer 7 are made of transparent glass, and the transparent glass can be alkali-free glass, soda-lime glass, etc., but not limited thereto. The first package layer 1 and the second package layer 7 can also be made of transparent materials such as transparent plastic materials.

Regarding to FIG. 1, the material/materials of the first light-transmitting electrode layer 2 of the preferred embodiment is/are selected from the group consisting of Fluorine-doped Tin Oxide (FTO), Indium Tin Oxide (ITO), Indium Zinc Oxide (IZO), Al doped-ZnO (AZO), Indium Tungsten Oxide (IWO), Indium Molybdenum Oxide (IMO), Zinc Tin Oxide (ZTO), Indium Titanium Oxide (ITiO), Indium Oxide Hydrate (IOH), and Antimony Tin Oxide (ATO), but not limited thereto.

In reference to FIG. 1 and FIG. 2, the material of the light-transmitting modification layer M in the second light-transmitting electrode layer 6 is selected from the group consisting of FTO, ITO, IZO, AZO, IWO, IMO, ZTO, ITIO, IOH, and ATO, but with no limitations. The work function of the light-transmitting modification layer M has a gradient. In a condition of a side of the light-transmitting modification layer M close to the second carrier transport layer 5, the difference between its work function and the work function of the second carrier transport layer 5 is within 0.1 eV. In another condition of another side of the light-transmitting modification layer M close to the first light-transmitting conductive layer 60 of the second light-transmitting electrode layer 6, the difference between its work function and the work function of the first light-transmitting conductive layer 60 is within 0.1 eV. In a regular structure, the second carrier transport layer 5 is an electron hole transport layer, so the energy level of the second carrier transport layer 5 is an electron hole transport layer valence band. On the contrary, for a inverted structure, the second carrier transport layer 5 is an electron transport layer, so the energy level of the second carrier transport layer 5 is an electron transport layer conduction band.

In reference to FIG. 1 and FIG. 2, for the preferred embodiment of the present invention, the material of the first light-transmitting conductive layer 60 in the second light-transmitting electrode layer 6 is selected from the group consisting of FTO, ITO, IZO, AZO, IWO, IMO, ZTO, ITIO, IOH, and ATO, but without any limitation.

In relation to FIG. 1 and FIG. 2, for the preferred embodiment of the present invention, the material of the metal conductive layer 62 in the second light-transmitting electrode layer 6 is Cu, Ni, Mo, Ag, Au, etc., or other kind of alloies. Additionally, a metal conductive layer 62 is composed of different metal layers by stacking.

As for FIG. 1 and FIG. 2, for the preferred embodiment of the present invention, the material of the second light-transmitting conductive layer 64 in the second light-transmitting electrode layer 6 is selected from the group consisting of FTO, ITO, IZO, AZO, IWO, IMO, ZTO, ITIO, IOH, and ATO, but not limited thereto.

As to FIG. 1, for the preferred embodiment of the present invention, the material of the light absorbing layer 4 is perovskite, which is a three-dimensional form, and is represented by the chemical formula $ABX_3$, wherein the A of $ABX_3$ is an univalent cation and is selected from the group consisting of formamidinium, methylammonium, Cs, Rb, and more than one; the B of $ABX_3$ is a divalent cation and is selected from the group consisting of Pb, Sn and more than one; and the X of $ABX_3$ is a univalent anion and is selected from the group consisting of Cl, Br, I, and more than one. In practice, perovskite is not limited by the three-dimensional form, which means Quasi-two-dimensional, two-dimensional, one-dimensional or quantum dot form is an option as well.

So far as FIG. 1 is concerned, in the preferred embodiment of the present invention, the light-transmitting perovskite solar cell is a regular structure (n-i-p structure), therefore the first carrier transport layer 3 is an electron transport layer, and the second carrier transport layer 5 is an electron hole transport layer. On the other hand, as for another preferred embodiment of the present invention, the light-transmitting perovskite solar cell is a inverted structure (p-i-n structure), thus the first carrier transport layer 3 is an electron hole transport layer, and the second carrier transport layer 5 is an electron transport layer.

The material for the electron transport layer is a n-type semiconductor, and it is selected from the group consisting of $TiO_2$, $SnO_2$, PCBM ([6,6]-phenyl-C61-butyric acid methyl ester), zinc oxide (ZnO), vanadium pentoxide ($V_2O_5$), $Zn_2SO_4$, fullerene C60, fullerene C70, Fullerene derivatives, etc., but without any limit.

The material for the electron hole transport layer is a p-type semiconductor, and it is selected from the group consisting of Nickel Oxide (NiO), Copper (I) Iodide (CuI), CuPc, Copper (I) Thiocyanate (CuSCN), Redox Graphene, poly [bis(4-phenyl) (2,4,6-trimethylphenyl)amine (PTAA), 2,2',7,7'-tetrakis [N,N-di(4-methoxyphenyl)amino]-9,9'-spirobifluorene (Spiro-OMeTAD), poly(3,4-ethylenedioxythiophene) polystyrene sulfonate (PEDOT:PSS), Poly [N,N'-bis (4-butylphenyl)-N,N'-bis(phenyl)-benzidine] (Poly-TPD), and Poly(N-vinylcarbazole) (PVK), but not limited thereto.

In order to make it easy for those with ordinary knowledge in the technical field to understand the content of the present invention, the present invention will be further described below in conjunction with the embodiments and drawings. Therefore please refer to FIG. 1, FIG. 2, FIG. 3, and FIG. 4. Each embodiment is only used to illustrate the technical features of the present invention, and the content mentioned does not limit the present invention.

<<A Structure for a Light-Transmitting Perovskite Solar Cell and a Preparation Method Thereof>>

Figure 4:
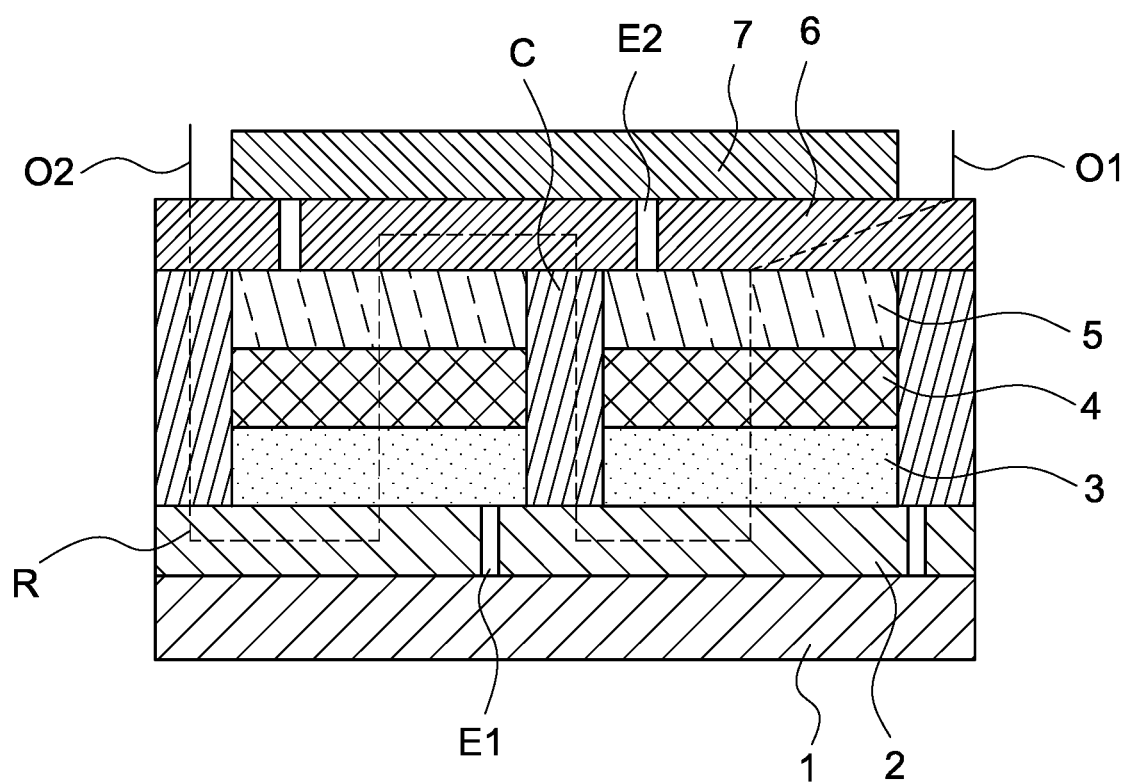
FIG. 4 illustrates a schematic view of two solar cell units in series.

With reference to FIG. 1, FIG. 2 and FIG. 4, the structure of the light-transmitting perovskite solar cell of the present invention adopts a regular structure as an exemplary structure. The total power generation area is 64 square centimeters, and 14 solar cell units are connected in series. According to FIG. 1 and FIG. 2, for the regular structure, the first package layer 1 is made of soda lime glass, the first light-transmitting electrode layer 2 is made of FTO, the first carrier transport layer 3 is an electron transport layer and is made of $TiO_2$, the light absorbing layer 4 is made of $MAPbI_3$. Therefore talking to the chemical formula $ABX_3$, the A of $ABX_3$ is Methylamine, the B is Pb, and the X is I. The second carrier transport layer 5 is an electron hole transport layer, and is made of Spiro-OMeTAD. The light-transmitting modification layer M, the first light-transmitting conductive layer 60 and the second light-transmitting conductive layer 64 in the second light-transmitting electrode layer 6 are all made of IZO. Further, the metal conductive layer 62 of the second light-transmitting electrode layer 6 is made of Cu. The thicknesses of the light-transmitting modification layer M, the first light-transmitting conductive layer 60 and the metal conductive layer 62 are 4 nm, 10 nm and 3 nm respectively. More, the thickness of the second light-transmitting conductive layer 64 is 10 nm, and the second package layer 7 is made of soda lime glass.

In accordance with FIG. 1 and FIG. 2, the specific preparation method of the above-mentioned exemplary structure of the light-transmitting perovskite solar cell is as follows. During the preparation method, the preparation direction is from a surface facing the light to a surface facing away from the light, wherein both the surface facing the light and the surface facing away from the light are two parts of the light-transmitting perovskite solar cell. First, the FTO glass is a substrate, and it has a transparent glass and an FTO layer, wherein the transparent glass in the FTO glass is the first package layer 1, and the FTO layer in the FTO glass is the first light-transmitting electrode layer 2. Continuously, the upper surface of the first light-transmitting electrode layer 2 is coated by the process of vacuum sputtering, then applied the precursor liquid containing nano-$TiO_2$, and annealed to 550° C. Therefore the first carrier transport layer 3 is formed to be as an electrone transport layer. Accordingly, the upper surface of the first carrier transport layer 3 is coated to form the light absorbing layer 4. The specific step is to apply a precursor liquid containing methylammonium iodide, lead iodide ($PbI_2$) and methylammonium chloride on the upper surface of the first carrier transport layer 3, then annealing to 120° C. is to form the light absorbing layer 4. Consequently, the upper surface of the light absorbing layer 4 is coated a precursor liquid having Spiro-OMeTAD, so as to form the second carrier transport layer 5 for being as an electron hole transport layer. Next, the light-transmitting modification layer M, the first light-transmitting conductive layer 60, the metal conductive layer 62, and the second light-transmitting conductive layer 64 are sequentially vacuum sputtered on the second carrier transport layer 5 to form the second light-transmitting electrode layer. 6. The light-transmitting modification layer M, the first light-transmitting conductive layer 60, the metal conductive layer 62, and the second light-transmitting conductive layer 64 in the second light-transmitting electrode layer 6 are produced by the sputtering of the physical vapor deposition (PVD), wherein the sputtering is vacuum sputtering. The working gas is filled in a vacuum environment, and then the target is sputtered with an ion beam to deposit the material to form the aforementioned light-transmitting modification layer M, the first light-transmitting conductive layer 60, the metal conductive layer 62, and the second light-transmitting conductive layer 64. The working gas is an oxygen-argon mixed gas, and the working gases with different oxygen-argon ratios can be obtained by fixing the argon gas flow rate and adjusting the oxygen flow rate. Therefore, the oxygen-argon ratio described below is the ratio obtained by that of the oxygen flow rate divided by the argon flow rate in the working gas. By way of adjusting the oxygen-argon ratio of the working gas, the efficiency of the conductivities, the work functions and the locations of the energy levels of the first light-transmitting conductive layer 60, the metal conductive layer 62, and the second light-transmitting conductive layer 64 can be adjusted. After completing the preparations of the second light-transmitting electrode layer 6, the soda-lime glass is disposed on the upper surface of the second light-transmitting electrode layer 6 to be as the second encapsulation layer 7. Finally, polyolefin elastomers (POE) glue (not shown in the figure) is used as a package film and is vacuum laminated at 120° C. for packaging.

The specific preparation method of the aforesaid light-transmitting perovskite solar cell further has an etching process and a filling process. The etching process is used in the prior art to shorten the path of carriers in the solar cells for avoiding carrier recombination due to material defects. During the preparation, the solar cell with a larger area is etched to form a solar cell unit in series. Hence, the electrode layers and serial channels are etched respectively in the preparation. Simultaneously, the serial channels are filled out with electrodes to form the serial solar cell unit. In FIG. 4, which illustrates a schematic view of two serial solar cell units. As shown in FIG. 4, the first light-transmitting electrode layer 2, the serial channel and the second light-transmitting electrode layer 6 are etched, wherein the serial channel is a structure formed by stacking the first carrier transport layer 3, the light absorbing layer 4 and the second carrier transport layer 5. A first etching line E1 is formed by etching the first light-transmitting electrode layer 2, as well as etching the second light-transmitting electrode layer 6 to construct a second etching line E2. There are three respective etching timings, which are the timings of completing the first light-transmitting electrode layer 2, the serial channels and the second light-transmitting electrode layer 6. After the serial channels are etched, the etching lines will be filled out by electrodes, in order to form a serial electrode C. Continuously, the preparation and etching for the second light-transmitting electrode layer 6 are being processed. The two ends of the serial electrode C being serially connected with the first light-transmitting electrode layer 2 and the second light-transmitting electrode layer 6 is to form a current path. Via the first etching line E1 and the second etching line E2, the first light-transmitting electrode layer 2 and the second light-transmitting electrode layer 6 are open circuits respectively, and the serial electrode C is serially connected with the adjacent solar cell unit, such that the aforesaid solar cell units are constructed.

In FIG. 4, the two edges of the two solar cell unit are cut, and some residual structures are produced. For instance, the left side of the serial channel of the left solar cell unit is connected with the residual serial electrode C after cutting, and the upper portion of the residual serial electrode C is connected with the residual second light-transmitting electrode layer 6; on the other hand, as shown in FIG. 4, the upper surface of the second light-transmitting electrode layer 6 of the right solar cell unit is electrically connected with a first external circuit O1. The upper surface of the residual second light-transmitting electrode layer 6 is electrically connected with a second external circuit O2, wherein the residual second light-transmitting electrode layer 6 is connected with the left side of the serial channel of the left solar cell unit. The current path R of the current flowing from the first external circuit O1 to the second external circuit O2 is shown as a dotted line in FIG. 4. As shown in FIG. 4, the current flows to the first external circuit O1, then goes to the second light-transmitting electrode layer 6, the serial channel and the first light-transmitting electrode layer 2 of the right solar cell unit. Sequentially, the current moves to the serial electrode C between the right and left solar cell units. Consecutively, the current reaches the second light-transmitting electrode layer 6, the serial channel and the first light-transmitting electrode 2 of the left solar cell unit. Finally, the current arrives at the left residual serial channel, the residual second light-transmitting electrode layer 6 and the second external circuit O2. The embodiment adopts sputtering to fill IZO as the serial electrode C, but not limited thereto in practice. Some other or at least one transparent electrode material can be filled to be as the serial electrode C, such as FTO, ITO, AZO, IWO, IMO, ZTO, ITIO, IOH, ATO, etc.

<<Resistance Measurement of a Single Light-Transmitting Conductive Layer>>

First, in the sputtering process of the experiment, Oxygen-argon mixed gases with different oxygen-argon ratios are used as working gases, in order to prepare an IZO layer and measure a sheet resistance thereof. The unit of the sheet resistance is Ohms/square meter ($\Omega$/sq). The substrates in each group are all transparent glass, and each group has the IZO layer with a thickness of 70 nm formed on the surface of the substrate by means of sputtering. In the process of sputtering, the oxygen-argon ratios of the working gas are 0, 0.01, 0.02, 0.04, 0.05, 0.07, and 0.1, wherein the result of the experiment is shown in Table 1, and pure argon is adopted if the oxygen-argon ratio is zero. Please refer to Table 1. The results in Table 1 show that when the argon flow rate is fixed and the oxygen to argon ratio is 0.04, the lowest sheet resistance is achieved. Then the first light-transmitting conductive layers 60 and the second light-transmitting conductive layers 64 of the follow-up embodiment are prepared to be the IZO layers by the process of sputtering, and the oxygen-argon ratio of the working gas in the process of sputtering for preparing the first light-transmitting conductive layers 60 and the second light-transmitting conductive layers 64 is fixed at 0.04. The aforesaid is exemplary, the materials of the first light-transmitting electrode layer 60 and the second light-transmitting electrode layer 64 are not limited to IZO, and could be other materials. Further, the oxygen-argon ratio of the working gas of the sputtering process can be modulated based on the materials of the first light-transmitting conductive layer 60 and the second light-transmitting conductive layer 64, in order to adjust the sheet resistances of the first light-transmitting conductive layer 60 and the second light-transmitting conductive layer 64.

TABLE 1

| Group | Oxygen-Argon Ratio | Sheet Resistance |
| --- | --- | --- |
| 1 | 0 | 83.84 |
| 2 | 0.01 | 62.09 |
| 3 | 0.02 | 58.46 |
| 4 | 0.04 | 57.10 |
| 5 | 0.05 | 59.82 |
| 6 | 0.07 | 154.99 |
| 7 | 0.1 | 1785.61 |

<<Light-Transmitting Modification Layer Component Test>>

To test the conditions of the working gas of preparing the light-transmitting modification layer M, the material of the light-transmitting modification layer M adopts IZO. The working gases with different oxygen-argon ratios are used to prepare the light-transmitting modification layers M in the process of sputtering. An ultraviolet photoelectron spectroscopy (UPS) measures the work function, and the result shows that the work function of the prepared light-transmitting modification layer M is −5.06 eV if the oxygen-argon ratio of the working gas is 0.1. The distance between−5.06 eV of aforesaid work function and −5.126 to −5.143 eV of the work function of Spiro-OMeTAD is within 0.1 eV (References: Hayashi R, Murota A, Oka K, Inada Y, Yamashita K. UV ozone treatment for oxidization of spiro-OMeTAD hole transport layer. RSC Adv. 2023 Jun. 20; 13 (27): 18561-18567. doi: 10.1039/d3ra02315j. PMID: 37346939; PMCID: PMC10280331). The material of the light-transmitting modification layer M uses IZO, the oxygen-argon ratio of the working gas represents a linear gradient during sputtering, and the oxygen flow rate is adjustable but the argon flow rate is fixed, thus the oxygen-argon ratio of the working gas is lowered down from 0.1 to 0.04. Under the above conditions, the oxygen-argon ratio of the working gas of the side, close to the second carrier transport layer 5, of the prepared light-transmitting modification layer M is 0.1. The oxygen-argon ratio of the side, close to the first light-transmitting conductive layer 60, of the light-transmitting modification layer M is 0.04. More, the material of the second carrier transport layer 5 is Spiro-OMeTAD, the material of the first light-transmitting conductive layer 60 is IZO, the oxygen-argon ratio of the working gas of preparing the first light-transmitting conductive layer 60 is 0.04, and the oxygen-argon ratio of the working gas of the side, close to the second carrier transport layer 5, of the light-transmitting modification layer M is 0.1. Thus, the work function difference between the side, close to the second carrier transport layer 5, of the light-transmitting modification layer M and the second carrier transport layer 5 is within 0.1 eV. Besides, the oxygen-argon ratio of the side, close to the first light-transmitting conductive layer 60, of the light-transmitting modification layer M is the same as the oxygen-argon ratio of the working gas of the first light-transmitting conductive layer 60, that is, both of the oxygen-argon ratios are 0.04. Hence, the work function of the side, close to the first light-transmitting conductive layer 60, of the light-transmitting modification layer M is the same as the work function for preparing the first light-transmitting conductive layer 60. Accordingly, the work function difference between the side, adjacent the first light-transmitting conductive layer 60, of the light-transmitting modification layer M and the first light-transmitting conductive layer 60 is within 0.1 eV.

In the experiment, an effect comparison for having the light-transmitting modification layer M to the solar cell components and not having the light-transmitting modification layer M to the solar cell components is being done. Therefore, a control group and an test group 1 are proposed to conduct component test. The component test uses a solar simulator to measure the current-voltage curve using forward voltage scan and reverse voltage scan under 1 sun condition, and the solar simulator automatically calculates the results of each test item. The test items include an optimal component efficiency (Eff), an open-circuit voltage ($V_{OC}$), a short-circuit current ($I_{SC}$), and a fill factor (FF). The irradiation intensity under 1 sun condition is 1,000 watt/m². The unit of the optimal component efficiency is "%", the unit of the open-circuit voltage is "V", and the unit of short-circuit current is "milliamp (mA)", and the unit of the fill factor is "%". The structure of the control group is basically the same as the exemplary structure of the part of "A STRUCTURE FOR A LIGHT-TRANSMITTING PEROVSKITE SOLAR CELL AND A PREPARATION METHOD THEREOF". The difference is that the entire second light-transmitting electrode layer 6 of the control group is instead of a 70 nm IZO layer, and the oxygen-argon ratio of the working gas of the sputtering on the IZO layer is fixed at 0.04. In addition, the structure of the test group 1 is basically the same as the exemplary structure of the part of "A STRUCTURE FOR A LIGHT-TRANSMITTING PEROVSKITE SOLAR CELL AND A PREPARATION METHOD THEREOF". The difference is that the entire structure of the first light-transmitting conductive layer 60, the metal conductive layer 62 and the second light-transmitting conductive layer 64 in the second light-transmitting electrode layer 6 is instead of a single IZO layer, which thickness is 70 nm. The light-transmitting modification layer M is disposed on the upper surface of the second carrier transport layer 5, and the IZO layer is disposed on the upper surface of the light-transmitting modification layer M. The material of the light-transmitting modification layer M of the test group 1 is IZO. Through the process of sputtering, the light-transmitting modification layer M is formed on the second carrier transport layer 5. The oxygen-argon ratio of the working gas represents a linear gradient during sputtering, the oxygen-argon ratio is gradually lowered down from 0.1 to 0.04, the thickness of the prepared light-transmitting modification layer M is 4 nm, and the oxygen-argon ratio of the working gas while executing the sputtering to IZO layer is fixed at 0.04. Table 2 shows the test results of component test for the control group of 3 production batches, and Table 3 shows the test results of component test for the test group 1 of 3 production batches. The forward voltage scan in Table 2 and Table 3 is marked with "Forward Scan", and the reverse voltage scan is expressed as "Reverse Scan". Compared to the control group, the average optimal component efficiency (Eff) of the test group 1 is raised 2.82%, that is mainly applied to the open-circuit voltage, the short-circuit current and the fill factor for raising 0.62 V, 4.98 mA and 8% respectively. As it can be known that adding the light-transmitting modification layer M deeply helps improving the interface between the second carrier transport layer 5 and the IZO layer. Therefore, in accordance with the aforesaid results of the experiments, the following material of the light-transmitting modification layer M adopts IZO to be as an exemplary, and the light-transmitting modification layer M is prepared by the process of sputtering. Further that, the oxygen-argon ratio of the working gas represents a linear gradient during sputtering, and the oxygen-argon ratio is gradually lowered down from 0.1 to 0.04.

TABLE 2

| Preparation Batch of Control group | Scan Mode | Eff. (%) | $V_{OC}$ (V) | $I_{SC}$ (mA) | FF(%) |
|---|---|---|---|---|---|
| 1 | Forward Scan | 8.29 | 12.44 | 87.62 | 49 |
|   | Reverse Scan | 11.14 | 12.78 | 90.56 | 62 |
| 2 | Forward Scan | 9.46 | 13.01 | 91.83 | 51 |
|   | Reverse Scan | 12.34 | 13.25 | 92.27 | 65 |
| 3 | Forward Scan | 11.78 | 12.95 | 99.27 | 59 |
|   | Reverse Scan | 13.86 | 13.13 | 100.02 | 68 |
| Average |   | 11.15 | 12.93 | 93.6 | 59 |

TABLE 3

| Preparation Batch of Test group | Scan Mode | Eff. (%) | $V_{OC}$ (V) | $I_{SC}$ (mA) | FF(%) |
|---|---|---|---|---|---|
| 1 | Forward Scan | 13.85 | 13.64 | 101.7 | 64 |
|   | Reverse Scan | 15.75 | 14.06 | 101.27 | 71 |
| 2 | Forward Scan | 12.53 | 13.25 | 94.88 | 64 |
|   | Reverse Scan | 14.40 | 13.47 | 95.08 | 72 |
| 3 | Forward Scan | 12.60 | 13.34 | 99.23 | 61 |
|   | Reverse Scan | 14.71 | 13.51 | 99.34 | 70 |
| Average |   | 13.97 | 13.55 | 98.58 | 67 |

<<Conductive Test>>

To determine the difference between the entire conductivity of the second light-transmitting electrode layer 6 and the prior arts, and to compare the influences of the metal conductive layer 62 with different thicknesses to the conductivity of the second light-transmitting electrode layer 6, an experimental group A, an experimental group B, an experimental group C, and the control group are to compare to each other. In the experiments A, B and C, the second light-transmitting electrode layer 6 is disposed on the partial upper surface of a conductive measurement platform through the process of sputtering, wherein the conductive measurement platform is an FTO glass, which has a transparent glass and an FTO layer, and the FTO layer is disposed on the upper surface of the transparent glass. The second light-transmitting electrode layer 6 is arranged on the partial upper surface of the conductive measurement platform, that is, the second light-transmitting electrode layer 6 is on the partial upper surface of the FTO layer by way of sputtering. The metal conductive layer 62 of the second light-transmitting electrode layer 6 is made of Cu. The light-transmitting modification layer M, the first light-transmitting conductive layer 60 and the second light-transmitting conductive layer 64 are made of IZO as exemplary examples. The process to prepare the light-transmitting modification layer M is described as that of the part of "LIGHT-TRANSMITTING MODIFICATION LAYER COMPONENT TEST". That is, the light-transmitting modification layer M is formed on the second carrier transport layer 5 by sputtering. The oxygen-argon ratio of the working gas represents a linear gradient during sputtering, and the oxygen-argon ratio is gradually lowered down from 0.1 to 0.04. The preparation process for the first light-transmitting conductive layer 60 and the second light-transmitting conductive layer 64 are described as that of the part of "RESISTANCE MEASUREMENT OF A SINGLE LIGHT-TRANSMITTING CONDUCTIVE LAYER". Both the first light-transmitting conductive layer 60 and the second light-transmitting conductive layer 64 are prepared by sputtering, and the oxygen-argon ratio of the working gas is fixed at 0.04 during sputtering. To measure the conductivities to the experimental groups A, B and C, the two probes of an ohmmeter are connected with the upper surface of the second light-transmitting conductive layer 64 of the second light-transmitting electrode layer 6 and the other partial upper surface of the conductive measurement platform respectively, and the horizontal distance between two probes is fixed at 1.5 cm. For the control group, its 70 nm IZO is disposed on the partial upper surface of the conductive measurement platform through sputtering, and the two probes of the ohmmeter are connected with the upper surface of the IZO and the other partial upper surface of the conductive measurement platform, and the horizontal distance between two probes is fixed at 1.5 cm as well. The control group is used to be as a transparent electrode layer in prior arts, in order to determine the differences of the thicknesses and conductivities of the second light-transmitting electrode layer 6 of the present invention and the transparent electrode layer in prior arts. The thickness of the light-transmitting modification layer M of each of the experimental groups A, B and C is 4 nm. The first light-transmitting conductive layer 60 in each of the experimental groups A, B and C is 10 nm in thickness, and so does to the thickness of the second light-transmitting layer 64 of the three experimental groups A, B and C. Beyond, the thicknesses of the metal conductive layer 62 of the experimental groups A, B and C are 3, 5 and 10 nm respectively. Although the thicknesses of the first light-transmitting conductive layers 60 of the experimental groups A, B and C are equal to the thicknesses of the second light-transmitting conductive layers 64 thereof, practically, the thicknesses of the first light-transmitting conductive layers 60 of the experimental groups A, B and C can also be greater/smaller than the thicknesses of the second light-transmitting conductive layers 64 thereof, and they are not limited thereto.

The test results of the conductivities of the experiments A, B and C and the control group are shown in table 4 and table 5. Table 4 represents the results of the thickness of IZO, the total thickness and the resistance, and table 5 demonstrates the results of the thicknesses of the light-transmitting modification layer M, the thicknesses of the first light-transmitting conductive layers 60, the thicknesses of the metal conductive layers 62, the thickness of the second light-transmitting conductive layer 64, total thicknesses and the resistances, wherein the units of the thicknesses of table 4 and table 5 are "nanometer", and the unit of the resistance is ohm, which symbol is "Ω". The metal conductive layers 62 are sandwiched between the first light-transmitting conductive layers 60 and the second light-transmitting conductive layers 64 of the experimental groups A, B and C respectively. Table 4 and table 5 represent that the thicknesses of the experimental groups A, B and C are highly decreased compared to the control group, that is, the thicknesses of the experimental groups A, B and C are about a half of the control group's. The resistances of the experimental groups A, B and C are reduced by more than two-thirds compared with the control group. This shows that the experimental groups A, B and C can not only significantly reduce the overall thickness, but also have lower resistances, that is, better conductivities.

TABLE 4

| Group | Thickness of IZO (nm) | Total Thickness (nm) | Resistance (Ω) |
|---|---|---|---|
| Control group | 70 | 70 | 60 |

TABLE 5

| Group | Thickness of Light-transmitting Modification Layer (nm) | Thickness of First Light-transmitting Conductive Layer (nm) | Thickness of Metal Conductive Layer (nm) | Thickness of Second Light-transmitting Conductive Layer (nm) | Total Thickness (nm) | Ohm (Ω) |
|---|---|---|---|---|---|---|
| Experimental group A | 4 | 10 | 3 | 10 | 27 | 19 |
| Experimental group B | 4 | 10 | 5 | 10 | 29 | 16 |
| Experimental group C | 4 | 10 | 10 | 10 | 34 | 13 |

<<Light Transmittance Measurement>>

Figure 3:
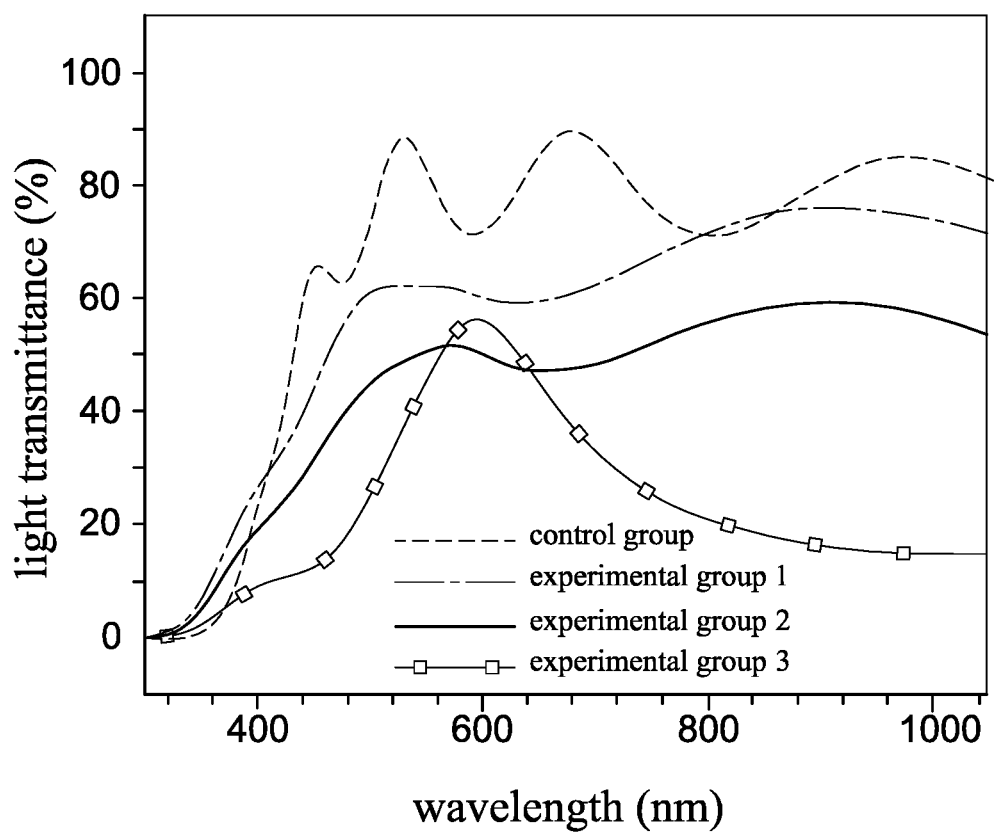
FIG. 3 illustrates an experiment result view of measuring light transmittances of experimental groups and a control group.

To determine the light transmittance of the second light-transmitting electrode layer 6 of the present invention, there are three experimental groups, which are the experimental groups 1, 2 and 3, shall be compared with the control group. The substrates of the experimental groups 1, 2 and 3 are transparent glasses. The substrate is coated the second light-transmitting electrode layer 6 by sputtering, and analyzed by an ultraviolet-visible spectrophotometer. An incident light, 300 to 1,000 nm, is used to measure the light transmittance. The metal conductive layer 62, the light-transmitting modification layer M, the first light-transmitting conductive layer 60, and the second light-transmitting conductive layer 64 in the second light-transmitting electrode layer 6 are made of Cu, IZO, IZO, and IZO respectively. The thickness of the light-transmitting modification M of each of the experimental groups is 4 nm. The thickness of the first light-transmitting conductive layer 60 of each of the experimental groups is 10 nm, and so does the thickness of the second light-transmitting conductive layer 64. The thicknesses of the metal conductive layers of the experimental groups 1, 2 and 3 are 3, 5 and 10 nm respectively. On the other hand, for the control group, a 70 nm IZO is coated on a substrate by sputtering, and an incident light, 300 to 1,000 nm, is used to measure the light transmittance, wherein the substrate of the control group is a transparent glass, and the results of the experiments are shown in FIG. 3. Since the energy gap of IZO is 3.1 eV, IZO will absorb the incident light with wavelengths less than 400 nm. Therefore, the low light transmittance of the incident light with wavelengths less than 400 nm is observed in the control group, experimental groups 1, 2 and 3. If the wavelength range of the incident light is between 500 and 800 nm, the light transmittance of the control group is in the range of 71~89%, the light transmittances of the experimental groups 1, 2 and 3 are 59~72%, 45~56% and 19~56% respectively. When the wavelength range of the incident light is between 800 and 1,000 nm, the light transmittance of the experimental group 2 is between 56 and 59%. That means greater than or equal to a half of the incident light, in the wavelength range of 800 to 1,000 nm, can pass. Further, the light transmittances of the experimental group 1 and the control group are 72~76% and 71~85% individually. It represents that among the plurality of experimental groups, the range of the light transmittance of the experiment group 1 is the most similar to the control group's, which means that experimental group 1 also has a good light transmittance when the wavelength range of the incident light is between 800 and 1,000 nm.

<<Embodiment Component Test>>

The experimental results of the aforementioned "LIGHT-TRANSMITTING MODIFICATION LAYER COMPONENT TEST" have shown that placing the light-transmitting modification layer M between the second carrier transport layer 5 and the single light-transmitting conductive layer can improve component performance. The experiment adopts the exemplary structure disclosed in the part of "A STRUCTURE FOR A LIGHT-TRANSMITTING PEROVSKITE SOLAR CELL AND A PREPARATION METHOD THEREOF" to be in the test group 2, and the test method is the same as the test method disclosed in the part of "LIGHT-TRANSMITTING MODIFICATION LAYER COMPONENT TEST". With reference to the aforesaid table 3 and a table 6 listed below, table 3 shows the test results of component test for the test group 1 of 3 preparation batches, and table 6 shows the test results of component test for the test group 2 of 3 preparation batches. Table 3 describes the average optimal component efficiency of the test group 1 is 13.97%, the average open-circuit voltage is 13.55 V, the average short-circuit current is 98.58 mA, and the average fill factor is 67%. In relative terms, the results from table 6 show the average component efficiency of the test group 2 is 14.31%. As it can be seen, the average component efficiency of the test group 2 is better than the test group 1. It means that the solar energy transferred to electrical energy by the test group 2 is better than the test group 1, and more than that, the average open-circuit voltage, the average short-circuit current and the average fill factor of the test group 2 are better. In general, the composite electrode composed of the light-transmitting modification layer M, the first light-transmitting conductive layer 60, the metal conductive layer 62, and the second light-transmitting conductive layer 64 of the present invention is able to make the solar cell to have better performances.

TABLE 6

| Preparation Batch of Test group 2 | Scan Mode | Eff. (%) | $V_{OC}$ (V) | $I_{SC}$ (mA) | FF(%) |
| --- | --- | --- | --- | --- | --- |
| 1 | Forward Scan | 12.59 | 13.31 | 92.92 | 65 |
|   | Reverse Scan | 14.21 | 13.67 | 94.57 | 70 |
| 2 | Forward Scan | 13.37 | 13.5 | 97.9 | 65 |
|   | Reverse Scan | 15.04 | 13.74 | 98.68 | 71 |
| 3 | Forward Scan | 14.41 | 13.97 | 103.07 | 64 |
|   | Reverse Scan | 16.22 | 14.28 | 102.3 | 71 |
| Average |   | 14.31 | 13.75 | 98.24 | 67.67 |

<<Residual Efficiency Calculation>>

To determine the stability of the test groups of the present invention, the tested efficiency measured at various measurement time points of the control group, the test group 1 in the aforesaid "LIGHT-TRANSMITTING MODIFICATION LAYER COMPONENT TEST", and the test group 2 in the previous "Embodiment Component Test" are divided by an initial efficiency for standardization. Therefore, the calculation formula is as following: residual efficiency (t)= (efficiency (t))/initial efficiency)×100%, and then the standard results with different preparation batches are averaged. The initial efficiency is defined by the in-time tested efficiency after finishing the preparation of the control group, test groups 1 or 2. The symbol "t" in the formula is measurement time points, which include day zero, day one, day two, day three, day four, day five, day six, and day seven. Since the efficiency measured on the day zero is the initial efficiency, the residual efficiencies measured on the day zero of the control group, test group 1 and test group 2 are all 100%, and the results are shown in Table 7. In the period of seven days, the control group, the test group 1 and the test group 2 are measured in the aspect of efficiency, wherein the day zero day is defined as the day that the preparations of the control group, the test group 1 and the test group 2 are done, and therefore the day for finishing the preparations of the control group, the test group 1 and the test group 2 is the day zero, and the day after day zero is day one. The results shown in table 7 disclose that the residual efficiencies of the test group 1 and the test group 2 maintain 94% and above during 7 days, but the residual efficiency of the control group is lower than 90% of an original from day two. Further, the residual efficiency of the control group is even lower than 80% from day five. These results means that the light-transmitting modification layer M is helpful to the stability of components. The residual efficiencies of the test group 1 and the test group 2 are not much difference within seven days. The test group 2 generates a higher initial efficiency in day zero. Hence, the present invention is certainly to promotes the entire light transmittance and the component efficiency of the solar cell unit.

TABLE 7

| Test Time | Group | | |
|---|---|---|---|
| | Residual Efficiency of Control group (%) | Residual Efficiency of Test group 1 (%) | Residual Efficiency of Test group 2 (%) |
| Day Zero | 100 | 100 | 100 |
| Day One | 91 | 96 | 97 |
| Day Two | 85 | 97 | 97 |
| Day Three | 87 | 97 | 102 |
| Day Four | 84 | 96 | 94 |
| Day Five | 76 | 95 | 95 |
| Day Six | 77 | 95 | 96 |
| Day Seven | 70 | 95 | 94 |

As a conclusion, the technical characteristics of the second light-transmitting electrode layer 6 of the light-transmitting perovskite solar cell of the present invention are able to indeed achieve the technical effects of light-transmitting, low resistance and energy level matching.

Although the present disclosure is disclosed in the foregoing embodiments, it is not intended to limit the present disclosure. Changes and modifications made without departing from the spirit and scope of the present disclosure belong to the scope of the claims of the present disclosure. The scope of protection of the present disclosure should be construed based on the following claims.

What is claimed is:

1. A light-transmitting perovskite solar cell comprising:
a first package layer (1);
a first light-transmitting electrode layer (2), disposed on an upper surface of the first package layer (1);
a first carrier transport layer (3), disposed on an upper surface of the first light-transmitting electrode layer (2);
a light absorbing layer (4), disposed on an upper surface of the first carrier transport layer (3);
a second carrier transport layer (5), disposed on an upper surface of the light absorbing layer (4);
a second light-transmitting electrode layer (6), disposed on an upper surface of the second carrier transport layer (5); and
a second package layer (7), disposed on an upper surface of the second light-transmitting electrode layer (6);
wherein the second light-transmitting electrode layer (6) includes a light-transmitting modification layer (M), a first light-transmitting conductive layer (60), a metal conductive layer (62), and a second light-transmitting conductive layer (64), the first light-transmitting conductive layer (60) being disposed on an upper surface of the light-transmitting modification layer (M), the metal conductive layer (62) being disposed on an upper surface of the first light-transmitting conductive layer (60), the second light-transmitting conductive layer (64) being disposed on an upper surface of the metal conductive layer (62);
wherein the material of the light-transmitting modification layer (M) is selected from the group consisting of FTO, ITO, IZO, AZO, IWO, IMO, ZTO, ITIO, IOH, and ATO; and
wherein the difference between the work function of the light-transmitting modification layer (M) and the work function of the second carrier transport layer (5) is within 0.1 eV, and the difference between the work function of the light-transmitting modification layer (M) and the work function of the first light-transmitting conductive layer (60) is within 0.1 eV.

2. The light-transmitting perovskite solar cell according to claim 1, wherein the first carrier transport layer (3) is an electron transport layer, and the second carrier transport layer (5) is an electron hole transport layer.

3. The light-transmitting perovskite solar cell according to claim 1, wherein the first carrier transport layer (3) is an electron hole transport layer, and the second carrier transport layer (5) is an electron transport layer.

4. The light-transmitting perovskite solar cell according to claim 1, wherein a thickness of the light-transmitting modification layer (M) is between 1 and 10 nm.

5. The light-transmitting perovskite solar cell according to claim 1, wherein a thickness of the metal conductive layer (62) is between 1 and 10 nm.

6. The light-transmitting perovskite solar cell according to claim 1, wherein a thickness of the metal conductive layer (62) is between 3 and 10 nm.

7. The light-transmitting perovskite solar cell according to claim 1, wherein a thickness of the first light-transmitting conductive layer (60) is between 1 and 100 nm.

8. The light-transmitting perovskite solar cell according to claim 1, wherein a thickness of the first light-transmitting conductive layer (60) is between 1 and 30 nm.

9. The light-transmitting perovskite solar cell according to claim 1, wherein a thickness of the second light-transmitting conductive layer (64) is between 1 and 100 nm.

10. The light-transmitting perovskite solar cell according to claim 1, wherein a thickness of the second light-transmitting conductive layer (64) is between 1 and 30 nm.

11. The light-transmitting perovskite solar cell according to claim 1, wherein a light transmittance of the light-transmitting perovskite solar cell is greater than 70% in a wavelength range between 800 and 1,000 nm.

* * * * *